TRANSISTOR AMPLIFIER HAVING PROTECTIVE CIRCUITRY
Filed June 17, 1963
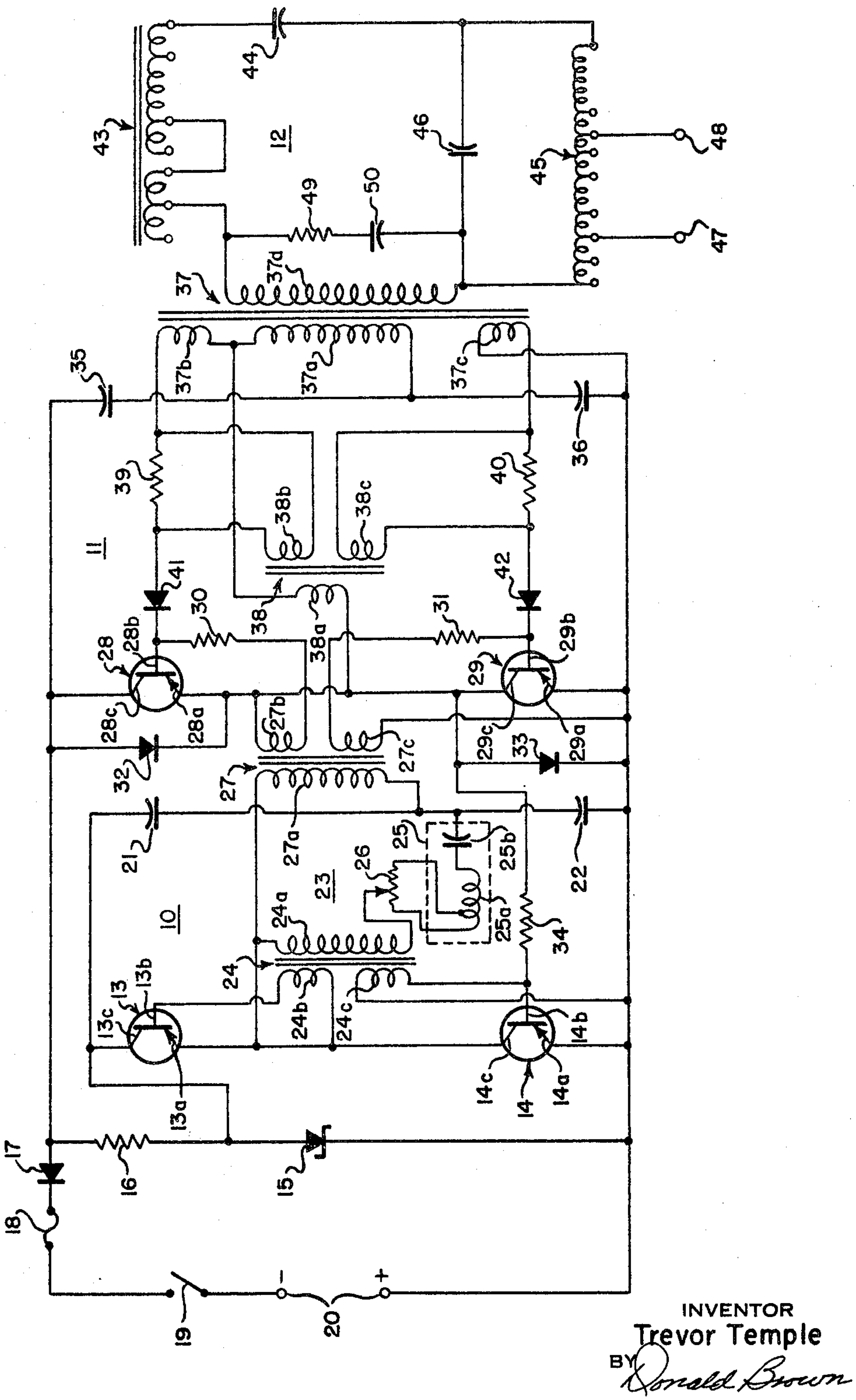
INVENTOR
Trevor Temple
BY Donald Brown
AGENT United States Patent Office 3,264,570
Patented August 2, 1966

3,264,570
TRANSISTOR AMPLIFIER HAVING PROTECTIVE CIRCUITRY

Trevor Temple, Kingston, N.H., assignor to Raytheon Company, Lexington, Mass., a corporation of Delaware Filed June 17, 1963, Ser. No. 288,216
4 Claims. (Cl. 330—15)

This invention pertains to a transistor oscillator and, more particularly, to an oscillator for producing an oscillatory signal which is relatively stable in both amplitude and frequency, even when the oscillatory signal is supplied to a varying, highly reactive load which may, at times, be a short circuit across the oscillator output.

While this invention has general utility, one application thereof is the generation of oscillatory signals to ring the tuned ringing bells of party line telephones. In such an application it is desirable to use highly reliable circuits, since failures result in an interruption in service. Heretofore, redundant circuits have been used to obtain the desired reliability. The problem of reliability is especially troublesome in this application since the oscillator is coupled to a variable, highly reactive load which may cause undesirable transients to be introduced in the oscillator output. Moreover, it is possible to have two or more oscillators supplying signals to one line at the same time, again resulting in a variable output load, including momentary shorts across the oscillator outputs.

The present invention provides the desired stable, accurate, reliable ringing supply by utilizing a square wave oscillator which operates at high efficiency with low losses and fewer semiconductor components than a conventional sinusoidal oscillator and by incorporating protective circuits in a transistor power amplifier following the square wave oscillator so as to protect against failure due to changing loads.

The term "square wave" as used herein is not restricted to waveforms having equal amplitude positive and negative excursions and, furthermore is not restricted to waveforms having equal time duration positive and negative excursions. Rather the term is used here to describe any waveform which varies between two amplitude levels, the time duration required for a transition from one level to the other being very much shorter than the time duration of any portion of the waveform during which the amplitude thereof is equal to one or the other of the two amplitude levels.

In accordance with one aspect of the invention, an oscillator for producing a stable sinusoidal oscillation comprises a square wave oscillator arranged to produce square waves at the same frequency or repetition rate as the desired sinusoidal oscillation. The square wave oscillator is coupled to a square wave power amplifier. The power amplifier includes protective circuits arranged to prevent breakdown or failure of the transistors in the power amplifier in any case where, because of instantaneous load variations, undesirable voltage-current combinations might be produced in such power amplifier transistors. The oscillator for producing a stable sinusoidal oscillation further comprises a band pass filter coupled to the output of the power amplifier and arranged to filter out the undesired harmonics present in the square wave signal so as to produce the desired sinusoidal oscillatory signal.

In accordance with a second aspect of the invention, the square wave oscillator comprises transistor means coupled to a source of unidirectional voltage. The oscillator further comprises an output or load circuit for the transistor means, the load circuit comprising a series resonant circuit tuned to the desired frequency of oscillation and a feedback circuit for coupling signals from the output of the transistor means to the input thereof in a regenerative fashion. The series resonant circuit controls the frequency of oscillation of the transistor means while the feedback circuit serves to alternately drive the transistor means between saturation and cutoff, producing a square wave output.

In accordance with a third aspect of the invention, the protective circuits in the power amplifier comprise feed back circuits arranged to block conduction in the power amplifier transistors whenever the output voltage of the power amplifier reverses while the input voltage to the amplifier does not reverse. The protective circuits still further comprise feed back circuits arranged to block conduction in the power amplifier transistors whenever the output current exceeds a limiting value.

The invention will now be further described with reference to the accompanying drawing which is an electrical schematic of an oscillator embodying this invention.

Referring now to the drawing, an oscillator constructed in accordance with the present invention comprises these sections, a square wave oscillator section 10, a square wave power amplifier section 11 and a band-pass filter section 12. Square wave oscillator 10 includes transistor 13 and transistor 14 connected in series across zener diode 15 with the emitter 13*a* of transistor 13 connected to the collector 14*c* of transistor 14, the collector 13*c* connected to the plate of zener diode 15 and the emitter 14*c* connected to the cathode of zener diode 15. Zener diode 15, in turn, is connected in series with dropping resistor 16, reverse polarity protective diode 17, fuse 18 and energizing switch 19 to the negative terminal of a D.-C. voltage supply 20, whose positive terminal is connected to the cathode of zener diode 15. Zener diode 15 acts as a voltage regulator and maintains a constant D.-C. voltage across the series combination of transistors 13 and 14 as well as across the series combination of capacitors 21 and 22. Reverse polarity protective diode 17 blocks any positive voltages which might otherwise be applied to the transistors if the circuit were inadvertently connected to the wrong terminals of supply 20. A load circuit, indicated generally at 23, is connected from the junction between capacitors 21 and 22 to the junction between emitter 13*a* and collector 14*c*. The load circuit 23 includes the primary winding 24*a* of a feedback transformer 24 and a series resonant circuit 25. Resonant circuit 25 includes an inductor 25*a* and a capacitor 25*b*. A variable resistor 26 is coupled across a portion of inductor 25*a*, with the movable contact of variable resistor 26 connected to one end of primary winding 24*a*. Variable resistor 26 serves as a fine frequency control to vary the resonant frequency of circuit 25. Secondary windings 24*b* and 24*c* of feedback transformer 24 are coupled, respectively, across the input terminals of transistors 13 and 14.

The primary winding 27*a* of an output coupling transformer 27 is coupled in parallel with load circuit 23 so as to couple the signals developed across load circuit 23 to power amplifier section 11. It should be noted that transistors 13 and 14 are connected in a single-ended push-pull configuration.

Power amplifier section 11 includes transistors 28 and 29, which like transistors 13 and 14, are arranged in a single-ended push-pull configuration. Transistors 28 and 29 are, however, connected across substantially the entire D.-C. voltage supply 20. The output signals from square wave oscillator 10 are supplied to transistors 28 and 29 by means of secondary windings 27*b* and 27*c*, respectively of transformer 27. Winding 27*b* is connected in series with resistor 30 across the input terminals (base 28*b* and emitter 28*a*) of transistor 28 while winding 27*c* is connected in series with resistor 31 across the input terminals (base 29*b* and emitter 29*a*) of transistor 29. Shunt diodes 32 and 33 are coupled, respectively, across the collector-emitter terminals of transistors 28 and 29 to provide low impedance paths for reverse current as will be more fully explained below. A starting resistor 34 is coupled between collector 29*c* and base 13*b* of transistor 13 to aid in the initiation of oscillations when the circuit is energized. A pair of capacitors 35 and 36 are connected in series between collector 28*c* and emitter 29*a*. The output of power amplifier section 11 appears across primary winding 37*a* of output coupling transformer 37. One extremity of winding 37*a* is connected to the junction of capacitors 35 and 36 while the other extremity of winding 37*a* is coupled via primary winding 38*a* of current sensing transformer 38 to the point of connection between emitter 28*a* and collector 29*c* of transistors 28 and 29, respectively. Secondary winding 38*b* is coupled across resistor 39 in the input circuit of transistor 28 to provide a signal to block conduction in transistor 28 as will be explained below. Secondary winding 38*c* is coupled across resistor 40 in the input circuit of transistor 29 for a similar purpose. Secondary feedback windings 37*b* and 37*c* feed back blocking signals to transistors 28 or 29 respectively, depending upon output voltage polarities. Diodes 41 and 42 are coupled to the bases 28*b* and 29*b*, respectively to prevent regenerative feedback to transistors 28 and 29.

The output of power amplifier section 11 is coupled via secondary winding 37*d* of output coupling transformer 37 to band-pass filter section 12. Band pass filter section 12 includes a series tuned combination of inductor 43 and capacitor 44 and a parallel tuned combination of tapped inductor 45 and capacitor 46. Output terminals 47 and 48 are connected to taps on inductor 45 to provide a desired output voltage level. Resistor 49 and capacitor 50 are coupled across secondary winding 37*d* to suppress any variations in the output signal which might otherwise occur as a result of transient ringing in the stray capacitance and leakage inductance of transformer 37.

In operation, when energizing switch 19 is closed, a negative D.-C. voltage of, for example, −50 volts is applied across the combination of dropping resistor 16 and zener diode 15, as well as across the combination of capacitors 35 and 36. The voltage across zener diode 15 may, for example, be −22 volts, which voltage appears across the series combination of equal capacitors 21 and 22. Current begins to flow in transistors 28 and 29 since the applied voltages are of proper polarity to initiate conduction therein. Current is bled through starting resistor 34 to base 14*b* of transistor 14 so as to aid in initiating conduction in square wave oscillator section 10.

By transistor action, current begins to flow in the circuit formed by emitter 14*a*, collector 14*c*, load circuit 23 and capacitor 22, as well as through primary winding 27*a* of transformer 27. The current flow through primary winding 24*a* of feedback transformer 24 induces a signal in secondary winding 24*c* of such polarity as to drive transistor 14 further into conduction. At the same time, the signal induced in the secondary winding 24*b* drives transistor 13 towards cutoff. The collector current in transistor 14, as a result of this regenerative action, is rapidly driven to saturation while transistor 13 is driven to cut off. During this period of rapid turn-on of transistor 14 the voltage at collector 14*c* changes from a value of one-half the voltage across zener diode 15 (i.e. the voltage across capacitor 22) to a voltage very close to that of emitter 14*a* (i.e. ground). This voltage change appears directly across primary winding 27*a* of output coupling transformer 27 and is coupled to power amplifier section 11. The voltage at collector 14*c* then levels off. During the period discussed above, current flows in series resonant circuit 25, thereby depositing charge on capacitor 25*b*. As this charge and the voltage across capacitor 25*b* increase, the current in this resonant circuit reaches a maximum and then begins to decrease in the well-known manner of series resonant circuits. The decreasing current causes a voltage to be induced in feedback transformer 24 of such polarity as to provide a positive-going signal to the base of transistor 14 and a negative-going signal to the base of transistor 13, driving transistor 14 towards cutoff and transistor 13 towards saturation. The regenerative feedback action of transformer 24 causes the transition to take place rapidly. The voltage at the emitter 13*a* rapidly drops towards the full negative voltage across zener diode 15 as conduction in transistor 13 approaches saturation. The voltage across load circuit 23 and primary winding 27*a* therefore similarly drops until transistor 13 reaches saturation. Subsequent cycles of square wave oscillation, under control of series resonant circuit 25, occur in the same manner as transistors 13 and 14 are switched alternately between saturation and cutoff.

The square wave oscillations are coupled via transformer 27 to power amplifier section 12. Secondary windings 27*b* and 27*c* are so phased with respect to primary winding 27*a* as to apply a signal to base 29*b* of the same polarity as appears from top to bottom of primary winding 27*a* and to apply a signal of opposite polarity to base 28*b*. Therefore, transistor 28 conducts when transistor 14 conducts and transistor 29 conducts when transistor 13 conducts.

The square wave output of power amplifier section 11 appears across primary winding 37*a*, and by means of secondary winding 37*d*, is coupled to band-pass filter section 12. The series tuned element (inductor 43 and capacitor 44) and the parallel tuned element (inductor 45 and capacitor 46) provide a maximum output signal at a frequency corresponding to the resonant frequency of inductor 25*a* and capacitor 25*b* (i.e. according to the desired frequency of the oscillatory output signal). A sine wave output is therefore produced by filtering action at output terminals 47 and 48.

Returning to power amplifier section 11, certain undesirable combinations of voltage and current which may occur in this stage can cause a secondary breakdown of transistors 28 and 29. That is, although the circuit is designed to operate within the absolute maximum current and voltage values which can be tolerated by the transistors, because of the rapid reversal of voltage and current in a square wave amplifier, and because of the varying reactive load which the amplifier feeds, it is possible to encounter large currents or voltages in the output circuit of this stage which are out of phase with the input signals. That is, the reactive load may store and release energy in a manner which can be harmful to the transistors. Thus, for example, if the output voltage reverses before or after a reversal occurs in the input signal (e.g. because of the phase differences between current and voltage in the highly reactive load) an incompatible voltage–current relationship may arise in one of the transistors 28 or 29. Although both transistor voltage and current values are within maximum limits of the transistor, a simultaneous out-of-phase existence of these parameters may lead to what is termed secondary breakdown of the transistors. Protective circuits are therefore provided in power amplifier section 11 to prevent such secondary breakdown.

In particular, secondary windings 37*b* and 37*c* of output coupling transformer 37 feed back voltages proportional to the output voltage to bases 28*b* and 29*b* respectively. The voltage fed back to base 28*b* is in phase with the output voltage while that fed back to base 29*b* is 180° out of phase with the output voltage. Thus, for example, since a negative voltage at the top of primary winding 37*a* is normally associated with conduction in transistor 28 (and therefore with a negative going signal at base 28*b*) a positive voltage is fed back to base 29*b* of transistor 29 whenever the output voltage is negative. In this way, any negative input voltage applied to winding 27*c* during an interval where the output voltage at winding 37*a* is negative would be neutralized by the feedback voltage supplied by winding 37c. Similarly, transistor 28 is held "off" when the output voltage across primary winding 37a is positive. Diodes 41 and 42 serve to block any regenerative feedback during normal operation. As soon as the out-of-phase condition ceases to exist (e.g. when the load voltage switches) the input signal applied via transformer 27 takes effect.

A second protective circuit, arranged to sense output current and feedback blocking signals to transistors 28 and 29 is also provided. This latter circuit includes current sensing transformer 38 and resistors 39 and 40, the resistors 39 and 40 being coupled to bases 28b and 29b, respectively by means of diodes 41 and 42. The output current of power amplifier section 11 passes through primary winding 38a, and by transformer action, signals are fed back, via secondary windings 38b and 38c to bases 28b and 28c, respectively. These signals, which are proportional to output current, are phased so as to cut off either transistor 28 or transistor 29, as may be required, if the output current exceeds a safe value for the transistors to switch. A transistor when switching from a high current saturated state to a high voltage "off" state may fail even though both current and voltage are within their maximum safe values when not applied simultaneously. Thus to protect the transistor from secondary breakdown, the peak collector current must be limited to a value determined by the transistor type and maximum use voltage.

For example, conduction in transistor 28 is normally associated with a negative voltage applied to base 28b by winding 27b and a negative voltage at the top end of winding 37a. Furthermore, under these conditions, current normally flows in a direction from winding 37a, through primary winding 38a to emitter 28a. Under these conditions, winding 38b of current sensing transformer 38 is phased to provide a signal across resistor 39 which is more positive on that end of resistor 39 which is coupled to diode 41 than on the other end thereof. This signal, if greater than the negative bias on the anode of diode 41 provided by the voltage in winding 37b, will cut-off transistor 28 protecting it from overcurrent.

As noted earlier, under these conditions, winding 37b feeds back a negative voltage which is normally blocked by diode 41. Winding 27b would also be supplying a negative voltage to base 28b. However, when the voltage across resistor 39 (which is proportional to output current) exceeds the difference between the negative voltage fed back by winding 37a (proportional to output voltage) and the negative voltage supplied by winding 27b (input voltage), diode 41 will conduct tending to block conduction in transistor 28. Therefore, the current sensing transformer 38 serves to block the "on" transistor (28 in this instance) by reverse biasing the base-emitter junction whenever the current exceeds a predetermined limit which is a function of the transistor input and output voltages. This limit is determined, in specific cases, by the current switching characteristics of the transistor being used. Diodes 32 and 33, in parallel with transistors 28 and 29, respectively, provide low impedance paths for the reverse current around the transistors 28 and 29.

A similar operation occurs when transistor 29 is initially conducting and the output current reverses without a corresponding reversal in input and output voltages.

While the invention has been described in a particular environment, it should be understood that the oscillator may be designed to operate over a wide range of frequencies, the selection of the inductors and capacitors in the tuned circuits determining the particular operating frequency.

Furthermore, the invention is not limited to the particular types of components illustrated nor to the particular circuit configuration. Rather the scope of the invention is pointed out in the following claims.

I claim:

1. A power amplifier comprising first and second transistors each having an input electrode, an output electrode, and a third electrode, means coupled to the input electrodes of said transistors for providing an input signal to each of said transistors, each of said transistor output electrodes providing an output voltage and an output current in response to said input signal, means coupling the output electrode of said first transistor to the third electrode of said second transistor, an output transformer for generating an output voltage signal and having a first primary winding coupled between the output electrodes of said transistors, means for blocking conduction of each of said transistors whenever said output voltage reverses while said input signal has not yet reversed including second and third primary windings for said output transformer each coupling one of said transistor input electrodes to said first primary winding for applying a signal proportional to said output voltage to said one input electrode, and means to block conduction of each of said transistors whenever said output current exceeds a maximum allowable value including a current sensing transformer having a primary winding coupled to said first primary winding and first and second secondary windings each coupled to the input electrode of one of said transistors for applying to said input electrode a current proportional to said output current.

2. A power amplifier comprising a pair of transistors each having an input electrode, output electrode, and third electrode and being coupled together in a single-ended push-pull configuration, means for coupling an input voltage signal to the input electrodes of said transistors to selectively place each of said transistors in a conductive state, output transformer means including a first primary winding coupled to each of said output electrodes of said transistor devices, said output transformer providing a signal to a utilization device in response to said input signal, and a protective circuit means providing a signal to each input electrode of said pair of transistors to block conduction of said transistors whenever the output voltage provided by each of said pair of transistors reverses while said input voltage has not yet reversed including second and third primary windings of said transformer each coupling the input electrode of one of said transistors to said first primary winding for applying a signal to said input electrode proportional to said signal provided to said utilization device.

3. A power amplifier comprising a pair of transistors each having an input electrode, output electrode, and third electrode and being coupled together in a single-ended push-pull configuration, means for coupling an input signal to each input electrode of said transistors to selectively place each of said transistors in a conductive state, an output signal coupling device connected to each output electrode of said transistors, and means for preventing secondary breakdown of said transistors whenever the output signal being provided by said transistors exceeds a predetermined peak value, said means for preventing breakdown feeding back to said transistors a portion of an output signal provided to said output coupling device by said transistors and including a current sensing transformer having a primary winding coupled to said output coupling device and first and second secondary windings each connected in parallel with resistance means and coupled to the input electrode of one of said transistors.

4. An amplifier comprising first and second transistors each having an input electrode, output electrode, and third electrode and being arranged in a single-ended push-pull configuration, means for applying an input selective actuating signal to the input electrodes of said transistors, unilateral current conducting means connected to each of said input electrodes, resistance means connected in series with each of said unilateral current conducting means, an output transformer for coupling an output voltage and current from said transistors to a load having a first primary winding coupled to the output electrodes of said transistors, means for preventing breakdown of said transistors comprising second and third primary windings on said output transformer each coupling one of said resistors to said first primary winding for feeding back a signal to the input electrode of one of said transistors to prevent conduction of said transistors whenever the input signal applied to said transistors is out of phase with the output voltage across said output transformer, and means for preventing conduction of said transistors whenever the output current provided by said transistors exceeds a safe switching value comprising transformer means coupled to said transistors for sensing the output current being provided by said transistors to said output transformer including a second primary winding coupled to said first primary winding and first and second secondary windings providing a signal back to said transistors to selectively block conduction of said transistors, each of said secondary windings being connected in parallel with one of said resistors.

References Cited by the Examiner

UNITED STATES PATENTS

| | | | |
|---|---|---|---|
| 2,971,126 | 2/1961 | Schultz | 331—113 |
| 3,026,486 | 3/1962 | Pintell | 331—113 |
| 3,036,274 | 5/1962 | Greatbatch | 330—15 |
| 3,065,429 | 11/1962 | Merkel | 330—15 |
| 3,094,673 | 6/1963 | Maupin | 330—15 |
| 3,111,632 | 11/1963 | Murphy | 331—113 |
| 3,117,270 | 1/1964 | Tailleur | 331—113 |

ROY LAKE, *Primary Examiner.*

JOHN KOMINSKI, *Examiner.*